United States Patent [19]

Nozue

[11] Patent Number: 5,677,756
[45] Date of Patent: Oct. 14, 1997

[54] APPARATUS FOR EXPOSING A SEMICONDUCTOR WAFER TO LIGHT INCLUDING AN ILLUMINATION OPTICAL SYSTEM COMPRISING A GLASS SUBSTRATE HAVING LIGHT-PERMEABLE PATTERNS

[75] Inventor: Hiroshi Nozue, Tokyo, Japan

[73] Assignee: NEC Corporation, Tokyo, Japan

[21] Appl. No.: 344,652

[22] Filed: Nov. 18, 1994

[30] Foreign Application Priority Data

Nov. 26, 1993 [JP] Japan .................. 5-296935

[51] Int. Cl.$^6$ ............................................. H01L 21/30
[52] U.S. Cl. ..................................... 355/53; 355/71
[58] Field of Search ........................... 355/53, 67, 71

[56] References Cited

U.S. PATENT DOCUMENTS 5,264,898 11/1993 Kamon et al. ..................... 355/67
5,452,053 9/1995 Nozue ............................... 355/53

FOREIGN PATENT DOCUMENTS 4-343215 11/1992 Japan .

OTHER PUBLICATIONS

M.D. Levenson et al., "Improving Resolution in Photolithography with a Phase-Shifting Mask", *IEEE Transactions on Electron Devices*, vol. ED-29, No. 12, Dec. 1982, pp. 1828-1836.

*Primary Examiner*—Joan H. Pendegrass
*Attorney, Agent, or Firm*—Sughrue, Mion, Zinn, Macpeak & Seas, PLLC

[57] ABSTRACT

An apparatus for exposing a semiconductor wafer to light, includes a light source, a glass substrate, a mask having thereon a first pattern composed of light-impermeable material, a projection lens, and an illumination optical system for radiating light derived from the light source to said mask to thereby transfer the pattern on a semiconductor wafer. The glass substrate constitutes a part of the illumination optical system and has a plurality of second patterns which are light-permeable and each of which has a different dimension from each other. The second patterns preferably are square in shape, and also preferably a combination of squares and equilateral triangles in shape.

17 Claims, 8 Drawing Sheets

5,677,756

APPARATUS FOR EXPOSING A SEMICONDUCTOR WAFER TO LIGHT INCLUDING AN ILLUMINATION OPTICAL SYSTEM COMPRISING A GLASS SUBSTRATE HAVING LIGHT-PERMEABLE PATTERNS

BACKGROUND OF THE INVENTION

1. Field of the Invention

The invention relates to an apparatus for exposing a semiconductor wafer to light, and more particularly to such an apparatus having an illumination optical system for illuminating a mask which serves as an original plate when micro patterns of LSI are to be formed on a semiconductor wafer through a projection lens.

2. Description of the Related Art

In a field of a very large scale integrated circuit (VLSI), an integration has been improved four times as much as that of three years ago. Such a high speed integration could be achieved by forming a circuit pattern in a quite micro-scale. When a pattern of VLSI is to be transferred on a semiconductor substrate, there is used a stepper which is an apparatus for miniflying a micro-scale pattern and projecting the minified micro-scale pattern on a semiconductor wafer to thereby transfer the pattern on the wafer. FIG. 1 schematically illustrates a conventional stepper. A light source 1 radiates a flux of exposure light 10. The exposure light 10 is converged by a reflection mirror 2, and then is uniformalized by a lens 3 and a fly's eye lens 4. Then, the exposure light 10 is narrowed down by an aperture 5A to a suitable diameter. The narrowed exposure light 10 is then uniformly radiated over a reticle 7 through a lens 6. The reticle 7 has a pattern 8 formed thereon and composed of chrome.

The incident light 10 to the reticle 7 is divided into diffracted lights by the chrome pattern 8, and hence to a projection lens 9 are transmitted a zeroth order diffracted light 11, a first order diffracted light 12 and a minus first order diffracted light 13. Higher order diffracted lights advance in a direction of a wider angle relative to the zeroth order diffracted light 11, and hence do not enter the projection lens 9. The diffracted lights 11, 12, 13 entering the projection lens 9 forms an image on a semiconductor wafer 10 in a minified scale. Thus, the same pattern as the chrome pattern 8 formed on the reticle 7 is projected on a semiconductor wafer in a minified scale.

A stepper is required to have a high resolving power or a high resolution, which is an ability to transfer a micro pattern to a semiconductor wafer. A resolution R of a stepper is denoted by the Rayleigh's equation as follows.

$R=k_1(\lambda/NA)$ where $\lambda$ represents a wavelength of an exposure light, NA represents a numerical aperture of a lens, and $k_1$ is a constant which is dependent on resist performance.

It can be easily understood from the Rayleigh's equation that a wavelength $\lambda$ of an exposure light has to be shortened or a numerical aperture NA has to be increased in order to lessen or improve the resolution R.

If a wavelength $\lambda$ is to be shortened, there has to be used a light source which radiates a light having a shorter wavelength than i-line (365 nm) of a Hg lamp conventionally used as a light source, and which has an intensity for conducting a sufficient exposure. Such a light source is a excimer laser only which radiates excimer laser light such as KrF excimer laser light having 249 nm of a wavelength and ArF excimer laser light having 194 nm of a wavelength.

However, a excimer laser needs highly frequent exchanges of gas or parts, and further expensive, resulting in cost up of a final product, namely a semiconductor device. Furthermore, even if a wavelength is intended to be shortened, it is almost impossible to obtain optical parts, optical material and resist material having high light-transmittance. In particular, it is quite difficult to design and manufacture a projection lens for minifying a pattern to be formed on a semiconductor wafer.

On the other hand, is a numerical aperture NA of a lens is intended to be increased, a depth of focus (DOF) has to be narrowed. The depth of focus D is also denoted by the Rayleigh's equation as follows.

$D=k_2(\lambda/(NA)^2)$ where $k_2$ is a constant which is dependent on resist performance it is understood from the above Rayleigh's equation that the depth of focus D is narrowed in inverse proportion to $(NA)^2$. Thus, there is a limit for increasing a numerical aperture NA of a lens.

To solve this problem, there has been suggested a phase-shifting mask by M. D. Levenson, et al. in "Improving resolution in photolithography with a phase-shifting mask", IEEE Trans. Electron Devices, Vol. 2, pp. 1828–1836, 1982. In this suggestion, there is disposed a phase-shifter in every other space between adjacent chrome patterns formed on a reticle. The phase-shifter inverts a phase of an exposure light. Thus, a phase of an exposure light transmitting a space between adjacent chrome patterns is inverted with the result that a zeroth order diffracted light is vanished. Hence, only plus and minus first order diffracted lights are used for exposure to thereby make it possible to enhance both a resolution and a depth of focus.

However, a phase-shifting mask takes a longer time than a conventional process for manufacturing a mask, and hence needs a complex and expensive apparatus. Furthermore, a material from which a phase-shifting mask is manufactured is required to have high light-transmittance for an exposure light, and also to have properties that long time use does not deteriorate the material and that the material can be washed out. However, at the present stage, there can scarcely be found such a material.

To avoid such a problem, a process which is called "an oblique incidence exposure process" has been suggested in place of the phase-shifting mask. FIG. 2 schematically illustrates a stepper to be used for a conventional oblique incidence exposure process. The stepper has an aperture 5B having an opening 5C located not at the center of the aperture but around the center of the aperture, unlike the aperture 5A of a conventional stepper illustrated in FIG. 1. Because of the aperture 5B, exposure lights 10A and 10B passing through the opening 5C obliquely enters a reticle 7 to thereby separate into three diffracted lights including a zeroth order diffracted light, a first order diffracted light and a minus first order diffracted light. A zeroth order diffracted light 14 and a first order diffracted light 15 both derived from the exposure light 10A enters a projection lens 9, whereas a minus first order light 16 derived from the exposure light 10A does not enter the projection lens 9. A minus first order diffracted light derived from the exposure light 10B overlaps the zeroth order diffracted light derived from the exposure light 10A to thereby make a light 14. The light 14 enters the projection lens 9. Similarly, a zeroth order diffracted light derived from the exposure light 10B overlaps a first order diffracted light derived from the exposure light 10A to thereby make a light 15. The light 15 enters the projection lens 9. A first order diffracted light derived from the exposure light 1B does not enter the lens 9. Thus, lights 11A and 11B derived from the lights 14 and 15 passes through the projection lens 9 and form images on a semiconductor wafer 10.

As having explained, it is required in the oblique incidence exposure process that the zeroth order diffracted light derived from the exposure light 10A overlaps the minus first order diffracted light derived from the exposure light 10B, and the first order diffracted light derived from the exposure light 10A overlaps the zeroth order diffracted light derived from the exposure light 10B. An angle $\theta_1$ between the zeroth order diffracted light and the ±first order is diffracted lights varies in dependence on a pitch P between adjacent chrome patterns 8 of a reticle 7 in accordance with a following equation.

$$\sin \theta_1 = \lambda/P$$

Accordingly, when patterns having various dimensions are to be transferred to a semiconductor wafer by exchanging a reticle, it is necessary to select and use an aperture which provides an optimal diffraction angle. This is quite burdensome. In addition, if an oblique illumination is conducted using an aperture, there would pose a problem that a quantity of light is greatly reduced.

FIGS. 3A, 3B and 3C illustrate conventional apertures 18, 19 and 20. An aperture 18 illustrated in FIG. 3A is used for ordinary exposure, whereas apertures 19 and 20 illustrated in FIGS. 3B and 3C are used for oblique incidence exposure. An oblique incidence exposure conducted by using the aperture 19 illustrated in FIG. 3B is called a zonal illumination, and enhances both a resolution and a depth of focus for patterns ranging in all directions. An exposure conducted by using the aperture 20 illustrated in FIG. 3C is called a four-point illumination, and enhances both a resolution and a depth of focus for patterns ranging in X and Y directions. The four-point illumination provides higher resolution and depth of focus than the zonal illumination for patterns ranging in X and Y directions, but provides lower resolution and depth of focus than an ordinary exposure for patterns other than patterns ranging in X and Y directions. An opening 22 of the aperture 19 and openings 23 of the aperture 20 have smaller area than that of an opening 21 of the conventional aperture 18. Thus, in the oblique incidence exposure, a quantity of exposure light is reduced to one-fifth to a half of a quantity of light in ordinary exposure. This greatly reduces an ability of an stepper with the result of cost up of a semiconductor device.

Japanese Unexamined Patent Public Disclosure No. 4-343215 has suggested a process for conducing an oblique incidence exposure without reducing a quantity of light. In this process, on a reticle is placed an optical element having a periodic structure such as a grating, and an exposure light is obliquely directed to the reticle.

FIG. 4A schematically illustrates a stepper used in the above mentioned process. The stepper illustrated in FIG. 4A additionally has an optical element 24 relative to the stepper illustrated in FIG. 1. An exposure light 10 entering the optical element 24 generates diffracted lights due to periodic patterns 25 formed on the optical element 24. The periodic patterns 25 are arranged so that a zeroth order diffracted light is eliminated. Accordingly, only a first order diffracted light 26 and a minus first order diffracted light 27 enter a reticle 7. The first order diffracted light 26 and minus first order diffracted light 27 having entered the reticle 7 generate diffracted lights due to chrome patterns 8 formed on the reticle 7. A zeroth order diffracted light derived from the first order diffracted light 26 overlaps a first order diffracted light derived from the minus first order diffracted light 27 to thereby make a light 28, and a minus first order diffracted light derived from the first order diffracted light 26 overlaps a zeroth order diffracted light derived from the minus first order diffracted light 27 to thereby make a light 29. The lights 28 and 29 enter a projection lens 9 to thereby form images on a semiconductor wafer 10.

A stepper having no optical element 24 focuses three beams to thereby form images on a wafer, as illustrated in FIG. 1, whereas the above mentioned stepper illustrated in FIG. 4A focuses two beams to thereby form images on a wafer. Accordingly, even if a numerical aperture NA of the projection lens 9 is small, a high resolution can be obtained without the reduction of DOF as if an exposure is conducted using a lens having a high numerical aperture NA. FIG. 4B illustrates the optical element 24 on which a repeated pattern 25 composed of square projections is formed, and FIG. 4C is a cross-sectional view taken along a line A—A of FIG. 4B. The optical element 24 improves both a resolution and a depth of focus for patterns ranging in X and Y directions along which diffracted lights would be generated. The optical element 24 has the same ability as that of the four-point illumination illustrated in FIG. 3C. In addition, the reduction of a quantity of light due to the use of the optical element 24 is quite small, and hence there is no problem regarding the deterioration of an capability of the stepper.

The oblique incidence exposure process, which uses a conventional optical element illustrated in FIG. 4A, has had a big problem.

First, since diffracted lights derived from the optical element are radiated only in X and Y directions, the oblique incidence exposure process can enhance a resolution and a depth of focus only for patterns disposed in X or Y direction. Accordingly, the process poses a problem that the process provides a lower resolution and depth of focus than an ordinary exposure for patterns which are disposed in 45 and 135 degrees directions and which are often used in a semiconductor.

Second, if there is to be used an optical element which is effective on chrome patterns disposed on a reticle and having a pitch $P_1$ between adjacent patterns, the optical element much deteriorates a depth of focus of patterns having a pitch $2P_1$. FIG. 5 shows a relationship between a pattern pitch and a depth of focus in a conventional optical element. When the pattern pitch is equal to 2P1, the depth of focus is greatly deteriorated relative to an ordinary exposure. Hereinbelow will be explained this phenomenon in detail.

FIG. 6 is a cross-sectional view of a conventional optical element. A light 26 entering a reticle 7 produces, by means of a chrome pattern 8A, a zeroth order diffracted light 26A, a first order diffracted light 26B and a minus first order diffracted light 26C. Similarly, a light 27 entering the reticle 7 produces, by means of the chrome pattern 8A, a zeroth order diffracted light 27A, a first order diffracted light 27B and a minus first order diffracted light 27C. The first order diffracted light 26B and minus first order diffracted light 27C do not enter a projection lens 9, and thereby do not contribute to image-formation. When a pitch of the chrome pattern 8A is equal to $2P_1$, the minus first order diffracted light 26C overlaps the first order diffracted light 27B, and they normally enter the lens 9 from the top. Thus, the zeroth order diffracted lights 26A and 27A, the minus first order diffracted light 26C and the first order diffracted light 27B enter the projection lens 9. Diffracted lights normally entering the lens 9 from the top increases a quantity of exposure lights and thereby enhance a capability of a stepper. However, such diffracted lights works as a noise for image-formation, and thus a depth of focus is made to be deteriorated. When a pitch between adjacent chrome patterns is equal to 2P1, the minus first order diffracted light 26C and first order diffracted light 27B normally enter the lens 9 from the top together, and hence an intensity of light is increased and a depth of focus is greatly reduced.

SUMMARY OF THE INVENTION

It is an object of the present invention to provide an apparatus for exposing a semiconductor wafer to light, which apparatus has an improved resolution and also an improved depth of focus (DOF).

The invention provides an apparatus for exposing a semiconductor wafer to light, including a light source, a glass substrate, a mask having thereon a first pattern composed of light-impermeable material, a projection lens, and an illumination optical system for radiating light derived from the light source to the mask to thereby transfer the pattern on a semiconductor wafer. The glass substrate constitutes a part of the illumination optical system and has a plurality of second patterns which are light-permeable and each of which has a different dimension from each other.

In a preferred embodiment, each of the plurality of second patterns is a polygon in shape.

In another preferred embodiment, each of the plurality of second patterns is rectangular in shape.

In still another preferred embodiment, each of the plurality of second patterns is a square in shape.

In yet another preferred embodiment, the plurality of second patterns include rectangles and triangles.

In still yet another preferred embodiment, the rectangles comprise squares.

In further preferred embodiment, the triangles comprise equilateral triangles.

In further preferred embodiment, the polygon is an octagon.

In further preferred embodiment, the plurality of second patterns are incongruent to each other.

In further preferred embodiment, the plurality of second patterns include two groups of rectangles, one is a first rectangle and the other is a second rectangle having an inner space shaped in a rectangle.

In further preferred embodiment, the inner space of the second rectangle is equal in shape to the first rectangle.

In further preferred embodiment, the plurality of second patterns are differently spaced from each other.

In further preferred embodiment, a distance between adjacent first rectangles is half a distance between adjacent second rectangles.

In further preferred embodiment, the plurality of second patterns include two groups of squares, one is a first square and the other is a second square having an inner space shaped in a square.

In further preferred embodiment, the inner space of the second square is equal in shape to the first square.

In further preferred embodiment, the first square has a side having a length equal to a half of a distance between adjacent first squares, and the second square has a side having a length equal to a half of a distance between adjacent second squares.

In further preferred embodiment, the polygon has sides equal to 8N wherein N is an integer.

The advantages obtained by the aforementioned present invention will be described hereinbelow.

As above mentioned, in the present invention, the glass substrate has a plurality of patterns formed thereon each of which has different dimensions from each other and which are composed of light-permeable material. The glass substrate constitutes a part of the illumination optical system. The glass substrate provides exposure lights by which oblique incidence exposure is most effective.

In addition, the glass substrate prevents deterioration of a quantity of light. Thus, a resolution and a depth of focus can be enhanced for a pattern having a pitch which is double a desired pattern pitch, or for a pattern arranged in 45 degrees direction, as well as a pattern arranged in X and/or Y directions. As a result, it is possible to provide a semiconductor device having a high performance and a low manufacturing cost.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Embodiment 1

Figure 1:
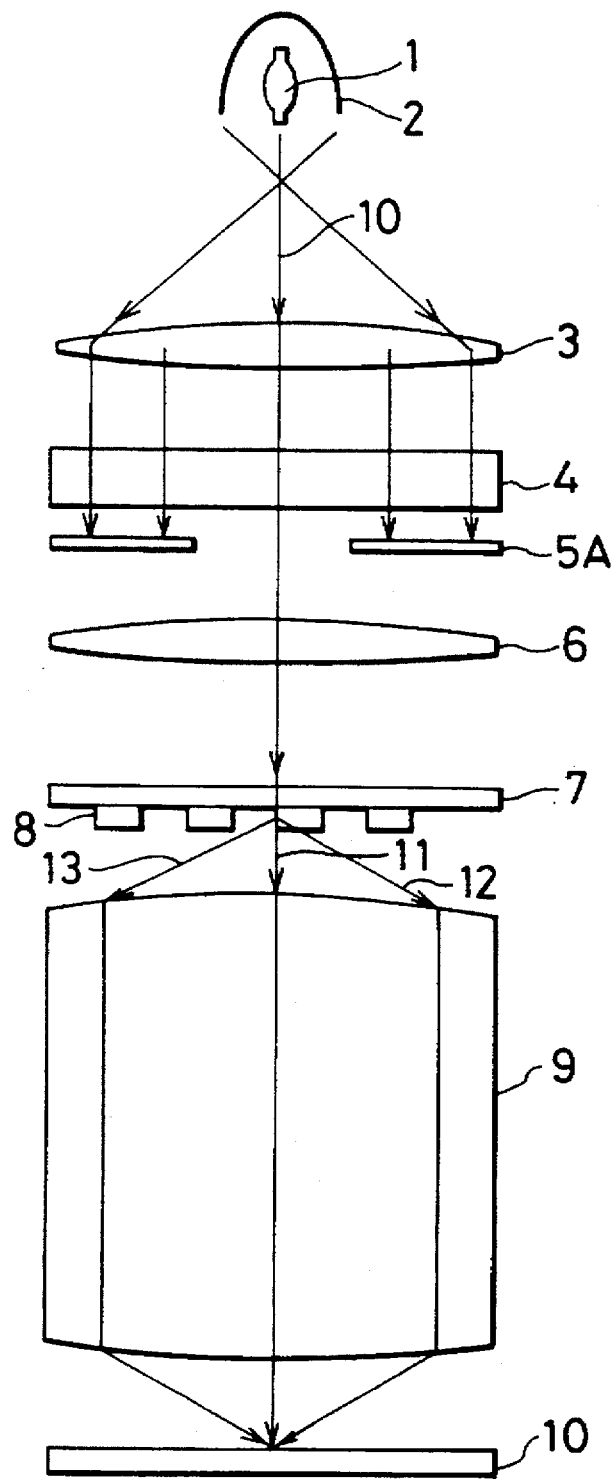
FIG. 1 is a schematic cross-sectional view of a conventional stepper to be used for an ordinary exposure.
Figure 2:
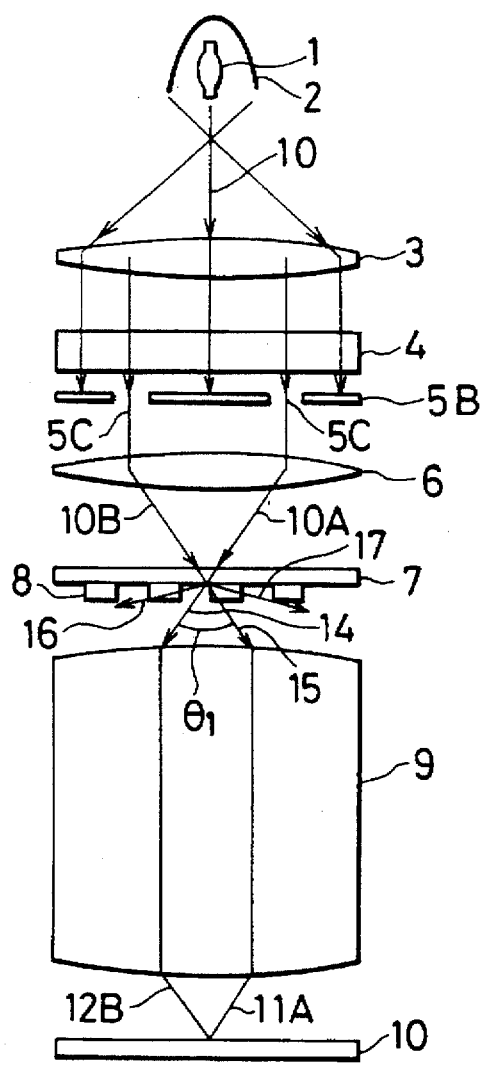
FIG. 2 is a schematic cross-sectional view of a conventional stepper to be used for an oblique incidence exposure.
Figure 3A:
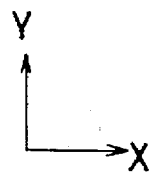
FIG. 3A is a plan view illustrating a conventional aperture.
Figure 3B:
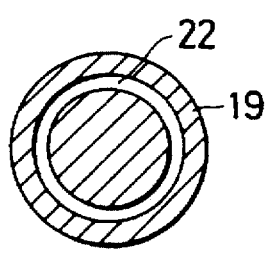
FIG. 3B is a plan view illustrating an aperture to be used for zonal illumination.
Figure 3C:
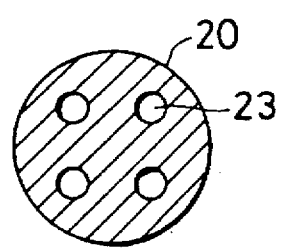
FIG. 3C is a plan view illustrating an aperture to be used for four-point illumination.
Figure 4A:
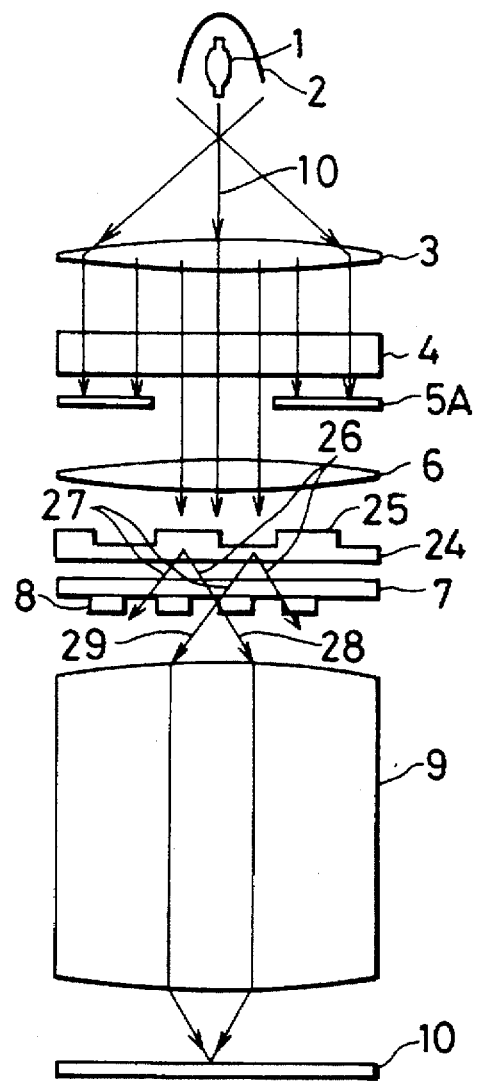
FIG. 4A is a schematic cross-sectional view of a conventional stepper to be used for an oblique incidence exposure.
Figure 4B:
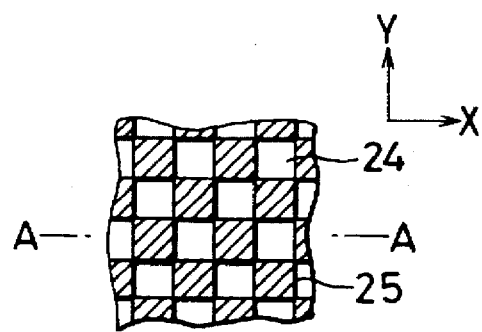
FIG. 4B is a plan view of a conventional optical element.
Figure 4C:
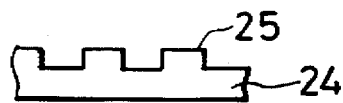
FIG. 4C is a cross-sectional view taken along the line A—A in FIG. 4B.
Figure 5:
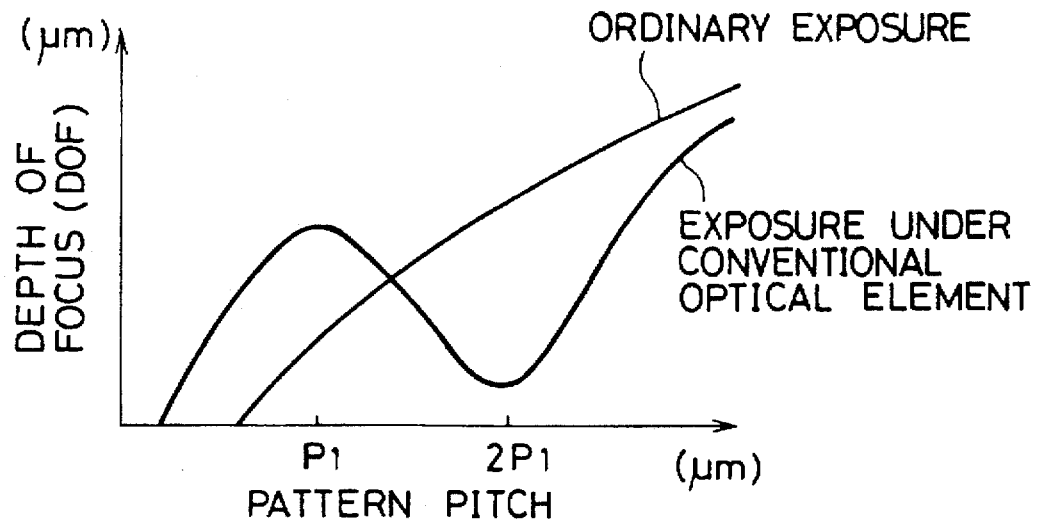
FIG. 5 is a graph showing a relationship between a pattern pitch and a depth of focus (DOF) in a conventional stepper.
Figure 6:
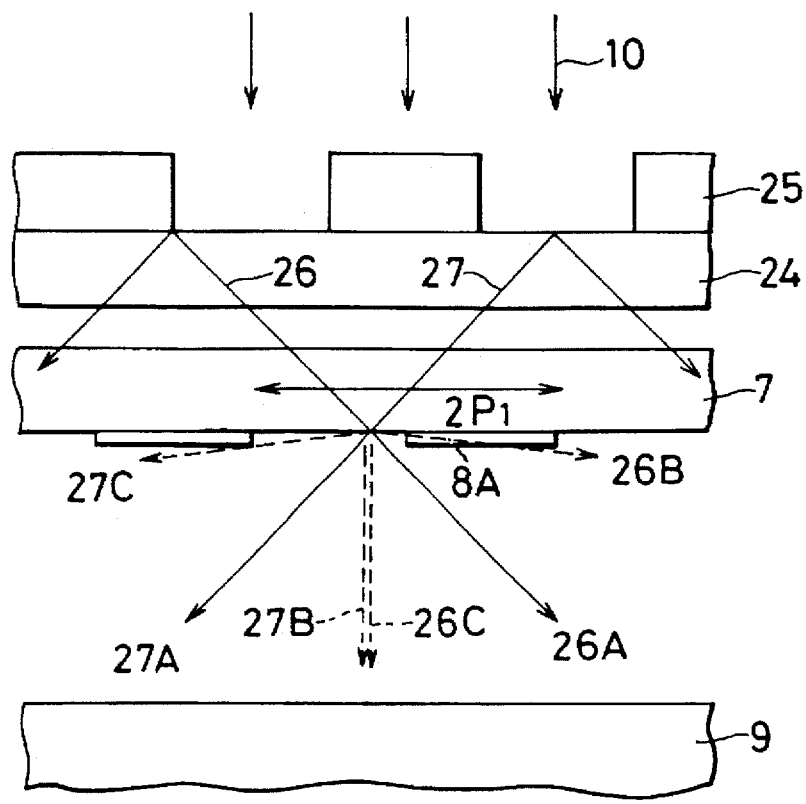
FIG. 6 is a partial cross-sectional view of a conventional stepper.
Figure 7:
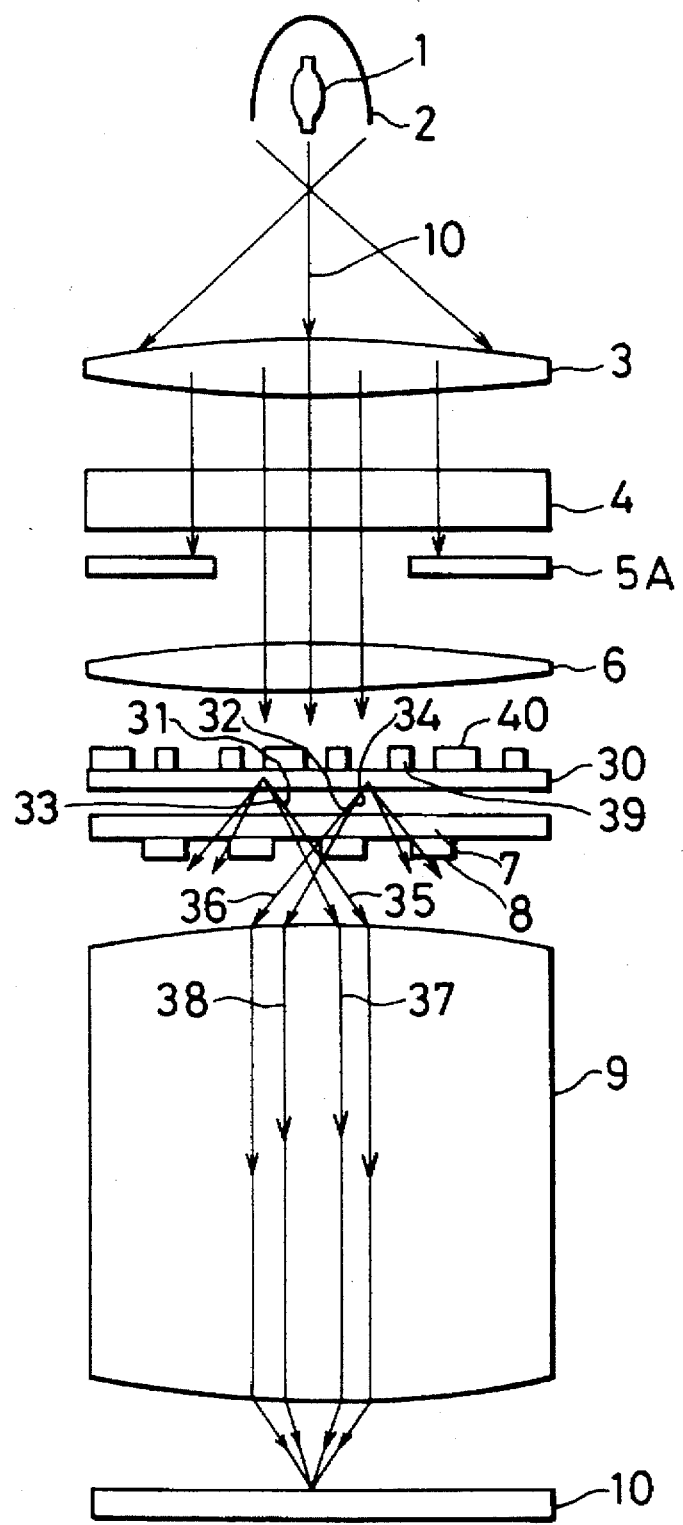
FIG. 7 is a schematic cross-sectional view of a first embodiment in accordance with the invention.

With reference to FIG. 7, exposure lights 10 originated from a light source 1 and gathered by a reflection mirror 2 enter a glass substrate 30 through a lens 3, a fly's eye lens 4 and an aperture 5A. The glass substrate 30 has a plurality of rectangular patterns 39 and 40 (see FIG. 8A) formed thereon. As will be explained later, the rectangular patterns 29 and 40 are incongruent to each other and have different dimensions from each other, and are composed of light-permeable material.

After having entered the glass substrate, ±first order diffracted lights derived from the exposure lights 10 enters a reticle 7 as main lights 31, 32, 33 and 34. A chrome pattern 8 formed on the reticle 7 further produces diffracted lights derived from the main lights 31 to 34. A zeroth order diffracted light derived from the main light 31 overlaps a first order diffracted light derived from the main light 32 to thereby make a light 35, and a minus first order diffracted light derived from the main light 31 overlaps a zeroth order diffracted light derived from the main light 32 to thereby make a light 36. The lights 35 and 36 pass through a projection lens 9. A zeroth order diffracted light derived from the main light 33 overlaps a first order diffracted light derived from the main light 34 to thereby make a light 37, and a minus first order diffracted light derived from the main light 33 overlaps a zeroth order diffracted light derived from the main light 34 to thereby make a light 38. The lights 37 and 38 pass through the projection lens 9. The lights 35, 36, 37 and 38 form images of the chrome pattern 8 on a semiconductor wafer 10.

Figure 8A:
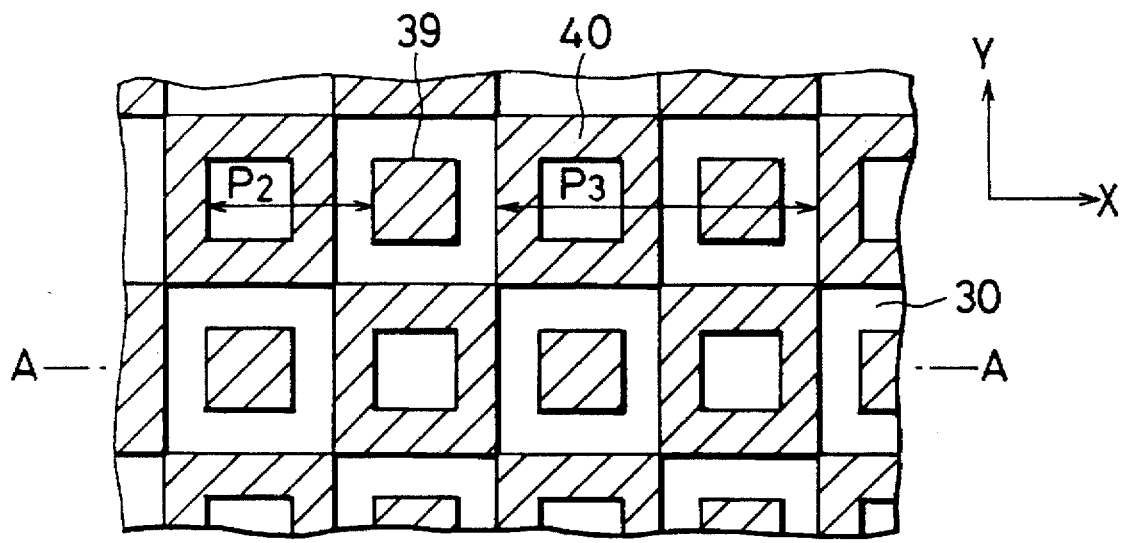
FIG. 8A is a plan view of a glass substrate used in the first embodiment.
Figure 8B:
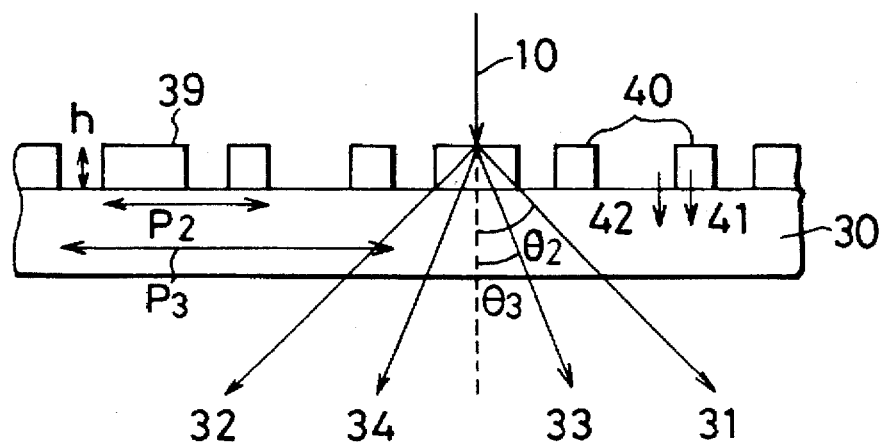
FIG. 8B is a cross-sectional view taken along the line A—A of FIG. 8A.

As shown in FIGS. 8A and 8B, on the glass substrate 30 are formed two kinds of square patterns 39 and 40 by means of spin of glass (SOG). The larger square pattern 40 has an inner space 40a shaped in square. The inner space 40a is equal in shape to the smaller square pattern 39. The smaller square patterns 39 are arranged to have a pitch $P_2$ between adjacent the patterns 39 and 40a, whereas the larger square patterns 40 are arranged to have a pitch $P_3$ between adjacent ones. In the first embodiment, a relationship between the pitches $P_2$ and $P_3$ is as follows.

$$P_3 = 2P_2$$

The exposure lights 10 having entered the glass substrate 30 produce diffracted lights by means of the smaller and larger square patterns 39 and 40. Supposing that a zeroth order diffracted light makes an angle $\theta(n)$ with a n-th order diffracted light, a following equation is established.

$$P \sin[\theta(n)] = n\lambda$$

Thus, the larger n becomes, the larger the angle $\theta(n)$ becomes. Hence, the n-th order diffracted light does not enter a projection lens. In addition, the larger n is, the lower intensity the n-th order diffracted light has, and hence it does not contribute to exposure. Accordingly, only zeroth order diffracted light and ±first order diffracted lights mainly contribute to the exposure.

Due to the smaller square patterns 39 formed on the glass substrate 30 and having a pitch $P_2$ between the pattern 39 and the square space 40a inside the larger square pattern 40 adjacent the pattern 39, a first order diffracted light 31 and a minus first order diffracted light 32 are produced. Similarly, due to the larger square patterns 40 having a pitch $P_3$ between adjacent ones, a first order diffracted light 33 and a minus first order diffracted light 34 are produced. Supposing that a zeroth order diffracted light makes an angle $\theta_2$ with the ±first order diffracted lights 31 and 32, and that a zeroth order diffracted light makes an angle $\theta_2$ with the ±first order diffracted lights 33 and 34, the angle $\theta_2$ is nearly equal to $2\theta_3$. These ±first order diffracted lights 31, 32, 33 and 34 enter the reticle as obliquely incident lights. The effect obtained by the obliquely incident lights is maximum when zeroth order diffracted lights 41 and 42 advancing in the same direction as that of the exposure lights are eliminated. To this end, it is necessary that a light 41 passing through a SOG pattern and a light 42 not passing through a SOG pattern have inverted phases to each other, and that the lights 41 and 42 have equal intensity.

Now, supposing that a height of the SOG pattern is denoted by "h", if the height h is arranged in accordance with the following equation, the lights 41 and 42 have inverted phases.

$$h = \lambda/[2(n-1)]$$

wherein $\lambda$ represents a wavelength of an exposure light, and n represents an index of refraction of SOG. In addition, if the smaller square pattern 39 is arranged so that it has a side having P2/2 of length and the larger square pattern 40 is arranged so that it has a side having P3/2 of length, the lights 41 and 42 have equal intensity if the SOG absorbs exposure lights, the intensity of the light 41 is lowered, so that an area of the SOG pattern necessarily is increased. It is not always necessary to entirely eliminate a zeroth order diffracted light. By varying the height and dimension of the SOG pattern, and also by adjusting the intensity of a zeroth order diffracted light, the exposure having an intermediate property between an ordinary exposure and an oblique incidence exposure may be conducted.

Figure 9A:
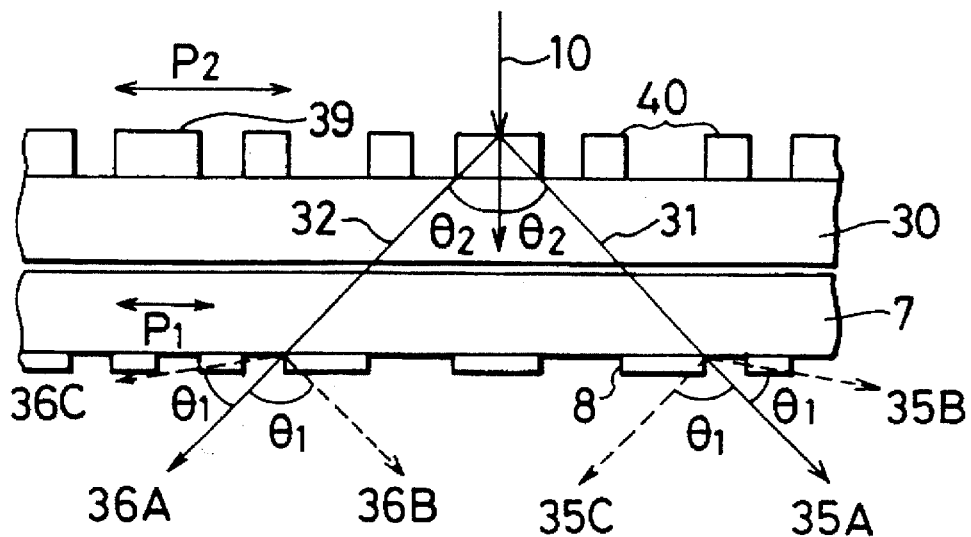
FIGS. 9A and 9B are partial cross-sectional views of a glass substrate and a reticle both used in the first embodiment.

Next, with reference to FIG. 9A, hereinbelow is explained that the embodiment provides a large depth of focus even when a dimension of the chrome patterns is double the size. As illustrated in FIG. 9A, the exposure light 10 having entered the glass substrate 30 produces a first order diffracted light 31 and a minus first order diffracted light 32 by means of the smaller square patterns 39 having a pitch $P_2$. A zeroth order diffracted light is eliminated. The diffracted light 31 further produces a zeroth order diffracted light 35A, a first order diffracted light 35B and a minus first order diffracted light 35C by means of the chrome patterns 8 formed on the reticle 7. The diffracted light 32 further produces a zeroth order diffracted light 36A, a first order diffracted light 36B and a minus first order diffracted light 36C by means of the chrome patterns 8. The maximum effect of the obliquely incident lights can be obtained when the zeroth order diffracted light 35A has the same direction as the first order diffracted light 36B and the minus first order diffracted light 35C has the same direction as the zeroth order diffracted light 36A.

To establish the above mentioned relationship, it is necessary to establish a relationship represented by the following equation.

$$P_2 = P_1(\sin\theta_1/\sin\theta_2) = P_1(\sin\theta_1/\sin(\theta_1/2)) = 2P_1$$

wherein P2 represents a pitch of the chrome patterns. $\theta_1$ represents an angle made by a zeroth order diffracted light and ±first order diffracted lights at the chrome patterns, and $\theta_2$ represents an angle made by a zeroth order diffracted light and ±first order diffracted lights at the smaller square patterns 39 of the glass substrate Namely, a pitch $P_2$ of the smaller square patterns 39 is required to be double a pitch $P_1$ of the chrome patterns 8.

Figure 9B:
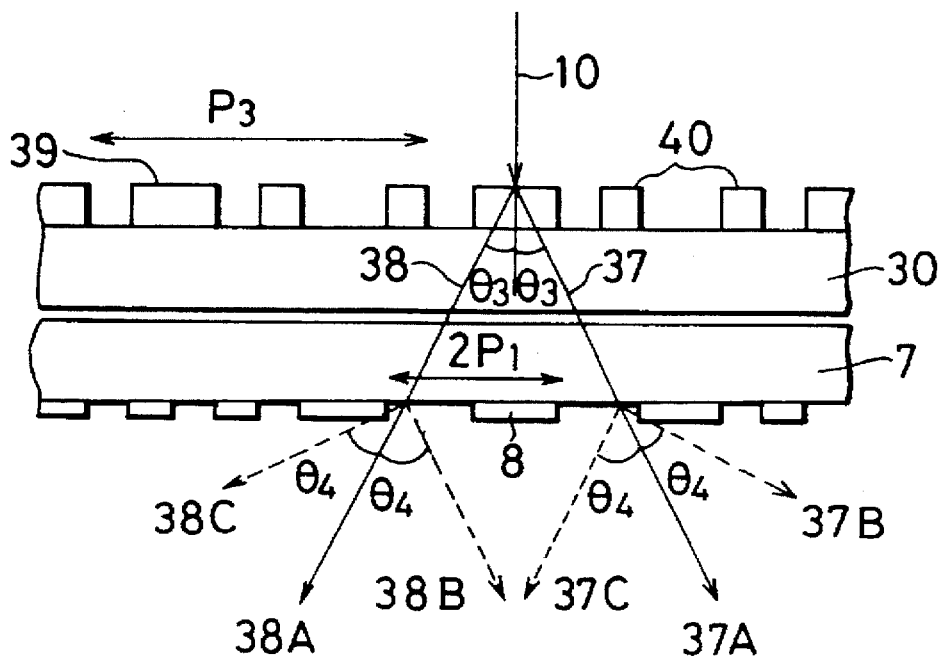

Hereinbelow, with reference to FIG. 9B, will be explained the reason why a depth of focus is increased even when the reticle 7 has patterns having a pitch $2P_1$. On the glass substrate 30 are formed the larger square patterns 40 having a pitch $P_3 = 2P_2$. The exposure light 10 having entered the pattern 40 produces a first order diffracted light 37 and a minus first order diffracted light 38 by means of the pattern 40. An angle $\theta_3$ made by the zeroth order diffracted light and the ±first order diffracted light is represented as follows.

$$\theta_3 = (\sin \theta_2/2)^{-1}$$

The first order diffracted lights 37 and 38 further produce diffracted lights by means of the chrome patterns formed on the reticle 7 at a pitch 2P1. Namely, the diffracted light 37 further produces a zeroth order diffracted light 37A, a first order diffracted light 37B and a minus first order diffracted light 37C, and the diffracted light 38 further produce a zeroth order diffracted light 38A, a first order diffracted light 38B and a minus first order diffracted light 38C. Supposing that the diffracted lights 37A and 38A make an angle $\theta_4$ with the ±first order diffracted lights, an effect due to the oblique illumination is maximum when the following equation is established.

$$P_3 = (2P_1)(\sin \theta_3/\sin \theta_4) = (2P_1)(\sin \theta_3/\sin (\theta_3/2)) = 2\times(2P_1) \quad (A)$$

As above mentioned, the pitch $P_3$ of the patterns 40 is equal to $2P_2$, and hence $$P_3 = 2 \times P_2 = 2 \times (2P_1)$$

Thus, it is confirmed that the equation (A) is established.

Accordingly, even when a pitch of the chrome patterns is equal to $2P_1$, the glass substrate used in the first embodiment provides an improved depth of focus.

Figure 10:
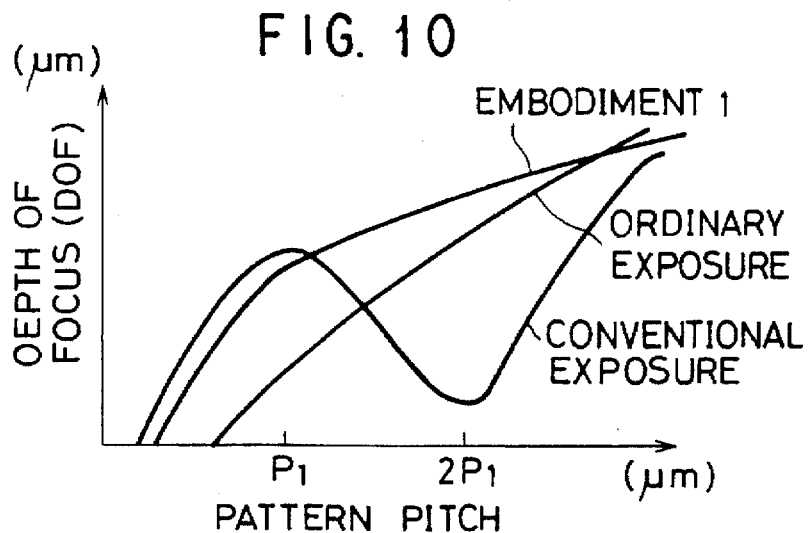
FIG. 10 is a graph showing a relationship between a pattern pitch and a depth of focus in the first embodiment.

FIG. 10 is a graph obtained by plotting depth of focus obtained by the first embodiment relative to a pattern pitch. As shown in FIG. 10, when a pattern pitch is equal to 2P1, a larger DOF is obtained than an ordinary exposure and a conventional process. In the first embodiment, the square patterns are manufactured by means of SOG, however, the patterns may be formed by etching a glass substrate or may be composed of sputter $SiO_2$ and other materials. All of the square patterns do not always have the same dimension. For instance, supposing one of the smaller patterns 39 has a side having a length $L_1$, the other smaller square patterns 39 may have a side having a length in the range from $0.1L_1$ to $1.9L_1$. Similarly, supposing one of the larger patterns 40 has a side having a length $L_2$, the other larger square patterns 40 may have a side having a length in the range from $0.5L_2$ to $1.5L_2$ in addition, the smaller and larger square patterns may be randomly arranged. The pitch $P_2$ may vary in the range from $1.2P_1$ to $3P_1$. This means that an advantageous effect by oblique illumination can be obtained even if the pitch P2 varies in the range from $1.2\times(2P_1)$ to $3\times(2P_1)$. Furthermore, it is not always required that the smaller square patterns 39 has common centers with the larger square patterns 40.

Embodiment 2

Figure 11:
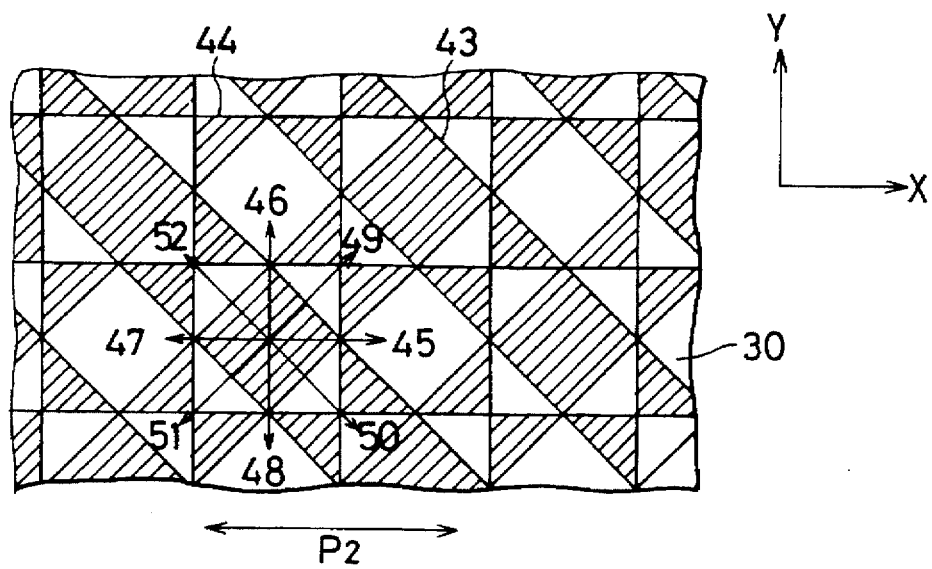
FIG. 11 is a plan view of a glass substrate to be used for a second embodiment in accordance with the invention.

FIG. 11 illustrates a glass substrate 30 to be used for a second embodiment. On the glass substrate 30 are formed a plurality of square patterns 43 and equilateral-triangular patterns 44 directing in various directions. The exposure light 10 radiated from above the glass substrate 30 produces first order diffracted lights 45 and 46 and minus first order diffracted lights 47 and 48 in X and Y directions, and further produces first order diffracted lights 49 and 50 and minus first order diffracted of 51 and 52 in directions forming an angle of 45 degrees with X and Y directions. Thus, though a conventional glass substrate provides advantages only in X and Y directions, the second embodiment greatly enhances a resolution and a depth of focus in 45 degrees directions as well as X and Y directions. The triangular patterns 44 and square patterns 43 may be formed of light-permeable material other than SOG similarly to the first embodiment. In addition, the patterns 43 and 44 may have various dimensions. For instance, supposing the square pattern 44 illustrated in FIG. 11 has a side having a length L, a length of a side of the square pattern 44 may be varied in the range from 0.1L to 1.9L. In addition, a pitch $P_2$ between the adjacent patterns does not always have to be fixed to be equal to $2P_1$. The pitch $P_2$ may vary in the range from $1.5P_1$ to $3P_1$.

Embodiment 3

Figure 12:
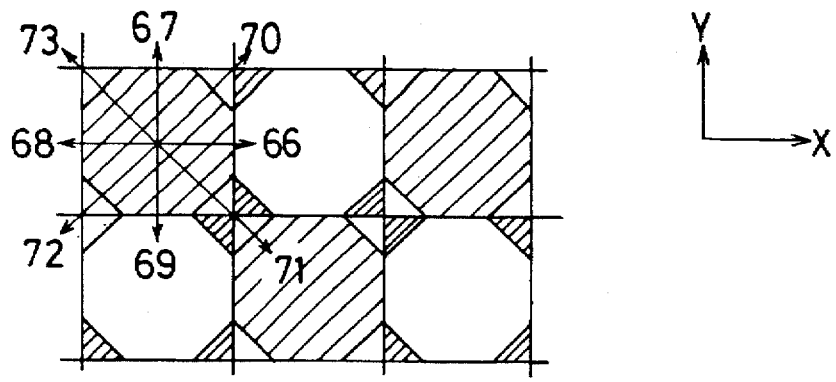
FIG. 12 is a plan view of a glass substrate to be used for a third embodiment in accordance with the invention.

In the first and second embodiments, the patterns 39, 40 and 43 are shaped in square. However, it should be noted that they may be shaped in rectangle Furthermore, patterns to be formed on a glass substrate may be shaped in polygon. For instance, the glass substrate 30 may have octagonal patterns 55 and equilateral-triangular patterns 56 formed thereon, as illustrated in FIG. 12. The exposure light 10 radiated from above the glass substrate 30 produces first order diffracted lights 66 and 67 and minus first order diffracted lights 68 and 69 in X and Y directions, and further produces first order diffracted lights 70 and 71 and minus first order diffracted lights 72 and 73 in directions forming an angle of 45 degrees with X and Y directions. Thus, the third embodiment greatly enhances a resolution and a depth of focus in 45 degrees directions as well as X and Y directions, similarly to the second embodiment.

In general, if patterns are formed so that they have sides equal to 8N wherein N is an integer, a resolution and a depth of focus are improved in 45 degrees directions as well as X and Y directions.

For instance, patterns may be shaped in pentagon. In this case, a resolution and a depth of focus are improved in 72, 144, 216 and 288 degrees directions. This is generalized that if patterns are shaped in a polygon having N sides, a resolution and a depth of focus may be improved in directions forming an angle of W with X or Y direction. The angle W is represented as follows.

$$W = (360/N)\times M$$

wherein M is an integer.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An apparatus for exposing a semiconductor wafer to light, said apparatus comprising:

a light source;

a glass substrate;

a mask having thereon a first pattern composed of light-impermeable material;

a projection lens for transferring said pattern onto a semiconductor wafer; and an illumination optical system provided between said light source and said glass substrate;

wherein said glass substrate has a plurality of second patterns disposed thereon, and said plurality of second patterns are light-permeable and each has a different dimension from each other.

2. The apparatus as recited in claim 1, wherein each of said plurality of second patterns is a polygon in shape.

3. The apparatus as recited in claim 2, wherein each of said plurality of second patterns is rectangular in shape.

4. The apparatus as recited in claim 3, wherein each of said plurality of second patterns is a square in shape.

5. The apparatus as recited in claim 1, wherein said plurality of second patterns include rectangles and triangles.

6. The apparatus as recited in claim 5, wherein said rectangles comprise squares.

7. The apparatus as recited in claim 5, wherein said triangles comprise equilateral triangles.

8. The apparatus as recited in claim 2, wherein said polygon is an octagon.

9. The apparatus as recited in claim 2, wherein said plurality of second patterns are incongruent to each other.

10. The apparatus as recited in claim 3, wherein said plurality of second patterns include two groups of rectangles, one is a first rectangle and the other is a second rectangle having an inner space shaped in a rectangle.

11. The apparatus as recited in claim 10, wherein said inner space of the second rectangle is equal in shape to said first rectangle.

12. The apparatus as recited in claim 2, wherein said plurality of second patterns are differently spaced from each other.

13. The apparatus as recited in claim 11, wherein a distance between adjacent first rectangles is half a distance between adjacent second rectangles.

14. The apparatus as recited in claim 4, wherein said plurality of second patterns include two groups of squares, one is a first square and the other is a second square having an inner space shaped in a square.

15. The apparatus as recited in claim 14, wherein said inner space of the second square is equal in shape to said first square.

16. The apparatus as recited in claim 15, wherein said first square has a side having a length equal to a half of a distance between adjacent first squares, and said second square has a side having a length equal to a half of a distance between adjacent second squares.

17. The apparatus as recited in claim 2, wherein said polygon has sides equal to 8N wherein N is an integer.

* * * * *